United States Patent [19]
Grim et al.

[11] Patent Number: 5,011,794
[45] Date of Patent: Apr. 30, 1991

[54] PROCEDURE FOR RAPID THERMAL ANNEALING OF IMPLANTED SEMICONDUCTORS

[75] Inventors: Karen A. Grim, Reading, Pa.; Shobha Singh, Summit, N.J.; LeGrand G. Van Uitert, Morristown, N.J.; George J. Zydzik, Columbia, N.J.

[73] Assignee: AT&T Bell Laboratories, Murray Hill, N.J.

[21] Appl. No.: 345,923

[22] Filed: May 1, 1989

[51] Int. Cl.$^5$ ............... H01L 21/00; H01L 21/02; H01L 21/18; H01L 21/20

[52] U.S. Cl. .................. 437/247; 437/248; 437/927; 148/DIG. 3; 148/DIG. 71; 432/253; 432/254.1; 118/50.1; 118/620; 118/733

[58] Field of Search ............... 437/247, 248, 927; 266/262; 432/253, 254.1; 148/DIG. 3, DIG. 71; 204/192.15, 192.25; 118/50.1, 620, 733

[56] References Cited

U.S. PATENT DOCUMENTS

| | | | |
|---|---|---|---|
| 4,698,486 | 10/1987 | Sheets | 437/247 |
| 4,731,293 | 3/1988 | Ekholm et al. | 204/192.15 |
| 4,794,217 | 12/1988 | Quan et al. | 437/247 |

FOREIGN PATENT DOCUMENTS

| | | | |
|---|---|---|---|
| 0143520 | 8/1983 | Japan | 437/247 |
| 0136925 | 8/1984 | Japan | 437/247 |

OTHER PUBLICATIONS

Seo K., High-Quality Si-Implanted GaAs Activated by Two-Step Rapid Thermal Annealing Technique, Appl. Phys. Lett. 47(5), Sep. 1, 1985, pp. 500–502.
Porterfield, W., Inorganic Chemistry, A Unified Approach Addison–Wesley, 1984, inside cover (front).
Pending U.S. Application, Ser. No. 945,016, filed 12/22/86, D. Chi, et al.
Co-pending U.S. Application, D. Fleming et al., Case 1-17-42-125-22, filed simultaneously herewith.
"Defects Introduced in Silicon Wafers During Rapid Isothermal Annealing:Thermoelastic and Thermoplastic Effects", J. App. Physics, 56 (10), Nov. 15, 1984, pp. 2922–2929, G. Bentini et al.
"Study of Electron Traps in n–GaAs Resulting From Infrared Rapid Thermal Annealing", J. Appl. Phys., 59 (9) May 1, 1986, M. Kazuhara et al., pp. 3131–3136.
"Phosphorus–Overpressure Rapid Thermal Annealing of Indium Phosphide", J. of Electronic Materials, vol. 16, No. 4, 1987, Ananth Dodabalapur et al., pp. 283–288.
Projected Range Statistics, Semiconductors and Related Materials, 2nd Edition, by James F. Gibbon, William S. Johnson and Steven W. Mylroie; Halstead Press, John Wiley and Sons, Inc., New York.

Primary Examiner—Brian E. Hearn
Assistant Examiner—B. Everhart
Attorney, Agent, or Firm—Oleg E. Alber

[57] ABSTRACT

This invention is directed to the fabrication of semiconductor devices, especially those comprising III-V and II-VI compound semiconductor materials, and involves Rapid Thermal Annealing (RTA) of semiconductor wafers, especially those implanted with a dopant(s). The invention is also concerned with a black-box implement used in combination with the RTA. The process includes enclosing a wafer to be annealed within a "black-box" comprising components of a black body material and subjecting the black box with the wafer therein to an RTA. In a preferred embodiment the RTA comprises (a) a pre-anneal step which includes heating to a temperature and for a period sufficient to preheat the wafer so as to reduce thermal shock due to a main annealing step, (b) the main annealing step being at a temperature and for a period sufficient to remove damage caused to said surface by the dopant implantation and to activate implanted dopant, and (c) a post-anneal step carried out at a temperature and for a period sufficient to relieve stresses which may result from the main-annealing step. The combined use of the RTA and the black box leads to wafers substantially free or slip lines and with reproducibly high mobilities and uniform activation.

56 Claims, 5 Drawing Sheets

GRAPHITE RING AND LID

GRAPHITE RING AND LID
SLOW COOLING

NO RING

QUARTZ RING

PROCEDURE FOR RAPID THERMAL ANNEALING OF IMPLANTED SEMICONDUCTORS

TECHNICAL FIELD

The invention is directed to the fabrication of semiconductor devices, especially those comprising III-V and II-VI compound semiconductor materials, which involves Rapid Thermal Anneal (RTA) of semiconductor wafers implanted with a suitable dopant. The invention is further concerned with an implement for enabling effective RTA of such wafers.

BACKGROUND OF THE INVENTION

In the production of semiconductor devices, wafers of semiconductor material may be doped with at least one dopant by ion implantation. This process invariably damages the implanted surface. It is desirable to remove this damage so as to present a high quality surface for subsequent processing steps, such as metallization. This is typically achieved by subjecting the implanted wafer to annealing which simultaneously activates the implanted ions.

Conventional long-term furnace annealing leads to a high-quality surface. Unfortunately, the furnace annealing is time and energy consuming, and may result in dopant profile broadening as well as the loss of volatile components (e.g. As from GaAs wafers or P from InP wafers) requiring maintenance of a specific atmosphere over a sample being annealed to compensate for the loss of the volatile component.

Lately, Rapid Thermal Annealing (RTA) is becoming increasingly useful in the processing of implanted semiconductors, especially of semiconductors comprising III-V and II-V compound semiconductors, including such as GaAs and InP and compound semiconductors lattice-matched to GaAs and InP such as InGaAs, InGaAsP, AlInAs, AlInAsP, etc. In the RTA process, the object being annealed is exposed to heat energy at high temperatures of up to 1100° C. for short periods of time such as from 1 to 30 seconds or more. For example, InP wafers are subjected to temperatures ranging from 700° to 800° C. while GaAs wafers are annealed at temperatures ranging from 800° to 1050° C.

The RTA method offers the advantage of removing the implantation damage with less dopant profile broadening compared to conventional furnace annealing. However, the RTA process is conducive to slip line formation as well as EN1 traps during the RTA.

Slip lines are regions of a wafer resulting from the introduction of thermoelastic stresses arising from high temperature exposure during the RTA and giving rise to thermoplastic phenomena involving dislocation glide. Since in the RTA method, the cooling of the sample takes place primarily by radiation, thermal gradients can occur due to variation in radiation intensity from different parts of the sample. For example, the edge of the wafer cools faster than the center due to the comparatively higher radiation from it. As a result, thermal stresses leading to the slip lines can be created by the thermal gradient in the wafer. G. Bentini, L. Correra and C. Donolato in "Defects Introduced in Silicon Wafers During Rapid Isothermal Annealing: Thermoelastic and Thermoplastic Effects", J. App. Phys. 56 (10), 15 Nov. 1984, pp. 2922-2929, describe formation of slip lines in silicon. This phenomena occurs in III-V and II-VI semiconductor materials as well.

Very often, the slip lines may extend for a considerable distance into the central area of semiconductor wafers, such as 1.3 cm. (0.5 inches) or more from an edge of a wafer about 5 or 7.6 cm. (2.0 or 3.0 inches, respectively) in diameter, resulting in regions which are not suitable for further processing, thus leading to poor device yield.

Additionally, EN1 traps may be introduced at higher RTA temperatures. In such compound semiconductors as n-GaAs the EN1 traps are typically introduced by RTA above 800° C. The EN1 trap is an electron trap with a certain activation energy from the conduction band and results from infrared heating during the RTA. This trap formation is closely related to a rapid heating stage in the RTA process and is never observed after conventional furnace annealing. For more detailed discussion of EN1 traps, see M. Kazuhara and T. Nozaki, "Study of Electron Traps in n-GaAs Resulting From Infrared Rapid Thermal Annealing", J. Appl. Phys. 59 (9), 1 May 1986, pp. 3131-3136. The formation of electron traps in n-GaAs from RTA has been studied using deep level transient spectroscopy. It has been reported by these authors that in addition to a number of trap levels generally present in as-grown bulk GaAs, a new trap EN1 with an activation energy of 0.20 eV from the conduction band and an electron capture cross section of $5.4 \times 10^{-16}$ cm$^2$, is formed in encapsulated GaAs annealed at 950° C. in an RTA.

It is important that the wafers annealed by RTA should possess not only reproducibly high mobilities and uniform activation, but should also be of morphological quality at least comparable to that obtained with the conventional furnace annealing. Thus, it is desirable to be able to subject the implanted semiconductor wafers to RTA while at the same time obtaining a high quality surface without any slip lines. Additionally, it is desirable to substantially avoid presence of EN1 trapped defects in the RTA treated wafers. These problems have been overcome in a manner described hereinbelow.

SUMMARY OF THE INVENTION

This invention concerns with the fabrication of semiconductor devices comprising III-V and II-VI compound semiconductors (RTA) which involves Rapid Thermal Anneal (RTA) of semiconductor wafers implanted with suitable dopant ions.

A wafer to be annealed is placed within a "black-box" implement comprising a base, a guard ring and a lid which is then positioned within an annealing chamber. The black-box implement is of a material which substantially absorbs incident radiation energy and dissipates energy principally by radiation. The RTA of the wafer annealed within the black-box results in wafers substantially free of slip lines. RTA carried out as a three-step anneal leads to reproducibly high mobilities and uniform activation. The three-step RTA includes a pre-anneal step at a temperature and for a period of time sufficient to reduce thermal shock to the wafer which otherwise may result from higher annealing temperatures, a main anneal step at a temperature and for a period sufficient to remove damage caused to the semiconductor surface by ion implantation and to activate dopant ions, and a post-anneal step at a temperature and for a period sufficient to relieve stresses resulting from the main-anneal step. The use of the three step RTA in combination with the black-box leads to wafers substantially free of slip lines and with reproducibly high mobilities and uniform activation.

DETAILED DESCRIPTION

Figure 1:
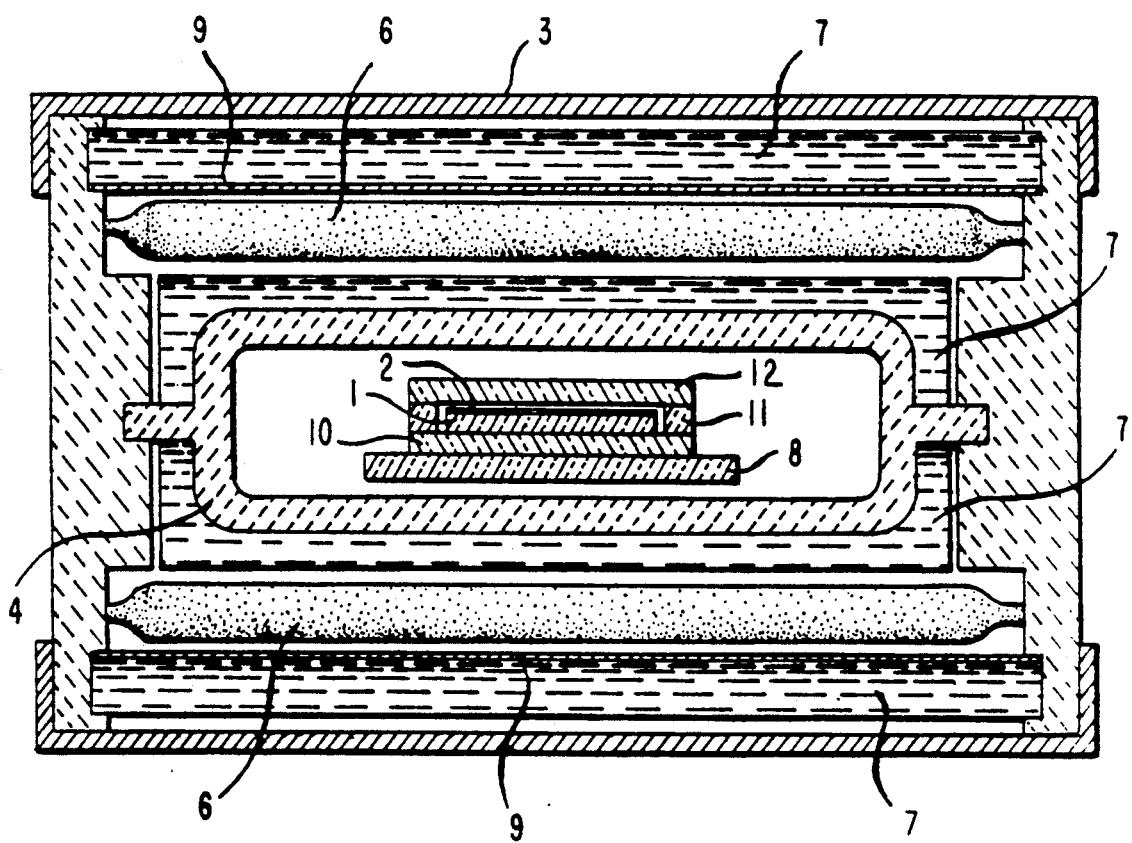
FIG. 1 is a partial perspective view of a heating chamber of a representative annealing apparatus, including some of its components used in conducting the RTA in accordance with the invention.

This invention is concerned with the fabrication of semiconductor devices comprising III-V and II-VI compound semiconductor materials which involves Rapid Thermal Anneal (RTA) of semiconductor wafers implanted with a suitable dopant. A technique and apparatus for annealing wafers by RTA with avoidance of slip lines and with reproducibly high mobilities and uniform activation are described below. Si-implanted GaAs wafers are being used as exemplary semiconductor wafers for illustrating the invention. Other semiconductor materials and other dopants may be treated with logical modifications utilizing the hereinbelow described teachings.

Wafers used in this illustration were originally undoped, (100) oriented, chem-mechanically polished, semi-insulating GaAs wafers that were about 5 cm (2 inches) in diameter and about 500 μm (20 mils) thick. Approximately 5 μm of the surface thickness of each wafer was removed by etching in a freshly prepared solution of 5 H$_2$SO$_4$: H$_2$O$_2$: H$_2$O prior to ion implantation. $^{29}$Si was implanted at room temperature in a non-channeling direction. The dose and energy of the implants were $3 \times 10^{12}$ cm$^{-2}$ and 60 KeV, respectively. Other doses ranging from $3 \times 10^{12}$ to $5 \times 10^{15}$ cm$^{-2}$ and energies ranging from 30 to 800 KeV may be used to implant these ions at room temperature. Prior to the RTA, the implanted wafers were capped (encapsulated) with a film of e-beam deposited glass in a thickness within a range from 10 to 500 nm. Phosphosilicate glass (PSG) containing from 1 to 15 mole percent P$_2$O$_5$, preferably 2 to 10 mole percent P$_2$O$_5$, is most suitable for use in RTA because of its excellent protective characteristics. For annealing purposes, a PSG film within a range of from 30 to 150 nm, typically approximately 100 nm thick, is adequate.

Presence of P$_2$O$_5$ in SiO$_2$ glass lowers its softening temperature and increases its thermal expansion coefficient, thus reducing stress during thermal annealing, especially by RTA. Also, presence of phosphorus inhibits further diffusion of, e.g. ion implanted donants on annealing. The P$_2$O$_5$ content of a PSG used as a barrier layer in the annealing procedure is selected such that the softening temperature is below an anneal temperature, but the melting point of an equivalent crystalline material is above the anneal temperature. Under these conditions, the glass layer forms a good barrier without stressing the semiconductor surface. P$_2$O$_5$ content above 15 mole percent still causes lowering of the stress, but the film might not be chemically inert. Amounts below 1 mole percent may still significantly reduce stress, however, only marginally reducing the glass softening temperature. Since for many applications, annealing is desired below 1200° C. (e.g. 800° to 1050° C. for GaAs), a typical useful range for the amount of P$_2$O$_5$ in PSG ranges from 2 to 10 mole percent. A more detailed discussion for the selection of the amount of P$_2$O$_5$ in PSG may be found in U.S. Pat. No. 4,731,293 issued on Mar. 15, 1988 to D. T. Ekholm et al.

The phosphosilicate glass may be very effectively and inexpensively prepared for use in e-beam deposition by sol-gel technique disclosed in a U.S. patent application Ser. No. 345,924 filed May 1, 1989 in the name of D. A. Fleming et al. (case 1-17-42-125-22). Some other glasses, such as borosilicate or commercially obtainable Vycor® (3% B$_2$O$_3$, 1% Al$_2$O$_3$ and 96% SiO$_2$, all by weight) may also be used for encapsulation. The use of borosilicate glass in fabrication of such devices as avalanche photodiodes is disclosed in U.S. Pat. No. 4,819,039 issued, Apr. 4, 1989 in the name of G. Chi et al. The use of PSG glass in preparation of various semiconductor devices including avalanche photodiodes is disclosed in the above-mentioned U.S. Pat. No. 4,731,293.

Wafers, 1, having an encapsulating film, 2, over an implanted surface, were annealed in an annealing apparatus under flowing dry inert gas, such as nitrogen (N$_2$), argon, forming gas, etc. Apparatus used for the RTA should be capable of providing thermal energy sufficient to preheat a semiconductor sample to a temperature intermediate a starting, e.g. room, temperature and a peak annealing temperature, and of providing high thermal energy, e.g. up to 1100°-1200° C. suitable for said peak annealing for a period ranging from 1 to 30 seconds. A microprocessor controlled HEATPULSE TM 410 halogen lamp annealing system, commercially available from AG Processing Technologies, Inc., 1325 Borregas Avenue, Sunnyvale, Calif., 94089, U.S.A., is suitable for this purpose.

A representative anneling apparatus includes a heating chamber, 3, shown in FIG. 1. The heating chamber includes a quartz isolation tube, 4, a lower and an upper bank of high-intensity tungsten-halogen lamps, 6, and conduits, 7, for carrying a suitable cooling fluid, such as water. Lamps 6 emit pulsed radiant energy to heat wafer 1 placed on a tray or susceptor, 8, within the isolation tube. At low temperatures the wafer absorbs visible light, and at high temperatures it absorbs infrared radiation. Reflective surfaces, 9, are provided to reflect the heat energy toward the isolation tube and enhance the uniformity of heat energy distribution.

Thermal processing occurs in isolation tube 4 between upper and lower banks of lamps 6. Tray 8 of suitable material, such as quartz, is removably positioned within isolation tube 4, and is used for supporting implanted and encapsulated wafer 1, being processed, within the tube. To monitor the annealing, the apparatus may be equipped with a pyrometer (not shown) and a thermocouple (not shown). The annealing temperature is typically controlled with pyrometer sensing, while wafer temperatures up to within a range of 625°-675° C. are monitored with a thermocouple, such as a chromel-alumel thermocouple. The thermocouple may be mounted in a suitable manner, such as on tray 8 beside the wafer, in contact with an underside of the wafer, or embedded in the wafer.

In accordance with the invention, implanted and encapsulated wafer 1 prior to being placed on tray 8 is enclosed within an implement which may be entitled a "black-box". The implement comprises three components: a base or plate, 10, for supporting wafer 1, a guard ring, 11, for encompassing the wafer, and a lid or cover, 12, for sealing a cavity formed by the base and the guard ring. The black box components are of a "black-body" material which absorbs substantially all incident radiation energy (i.e. the emission of lamps 6) and dissipates the absorbed energy principally by radiation. The black box components should also be of a material which is stable under operating conditions and inert with respect to the gaseous environment, e.g. $N_2$. In the illustrative example, the black box components are made of a material selected from graphite or silicon. Whenever it is desired to reduce the possibility of contamination of the material of the wafer by the material(s) of the black box components, especially at higher RTA temperatures, at least the internally facing surfaces of these components may be covered by an encapsulating glass film. The coating may be applied in a suitable thickness, such as 100–500 nm thick. The coating may be preferably of the same glass material as is used for capping the wafer. However, other encapsulating materials such as Vycor ® or $SiO_2$ may be used as well.

Figure 2:
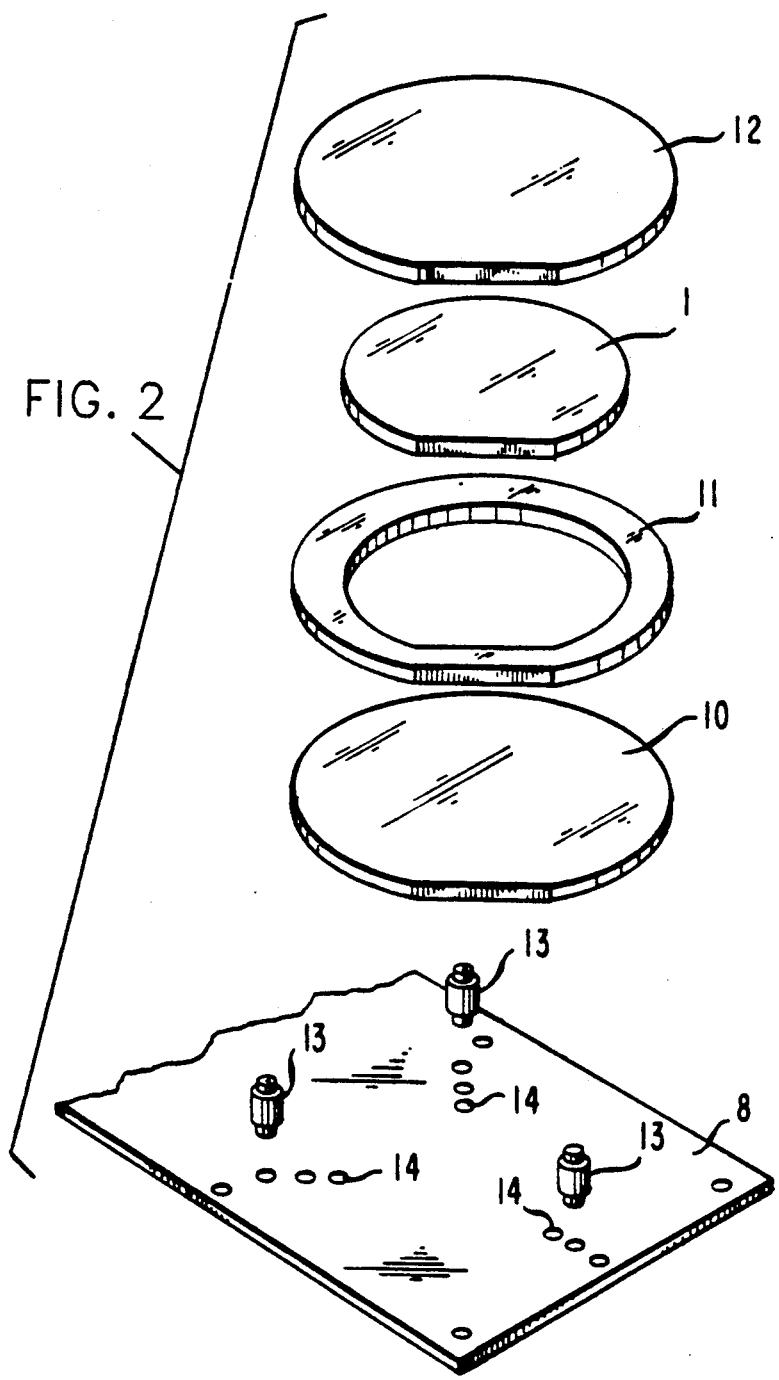
FIG. 2 is an exploded view of components of a "black-box" annealing implement being used for annealing semiconductor wafers in accordance with the invention.

The inside diameter dimension of guard ring 11 is somewhat larger than the dimension of wafer 1 to be annealed so as to allow for a small clearance between the implanted wafer and the guard ring. The clearance is provided to allow for the expansion of the wafer within the cavity while allowing efficient, evenly distributed transfer of heat between the guard ring of the black box and the wafer. For similar reasons, the height of the guard ring is somewhat greater than the thickness of the implanted wafer so that lid 12 is also spaced from implanted wafer 1. Typically for a wafer about 500 $\mu$m thick, the guard ring is from 600 to 900 $\mu$m high. This provides at least 100 $\mu$m clearance between the wafer and the lid. A similar clearance is provided between the inner walls of the guard ring and the wafer. The outside dimension of the guard ring, and thus, of the base and the lid, may be selected so as to fit within the boundaries of retainers 13 positionable on the tray within selected spacing apertures 14 (FIG. 2). Typically each of the base, lid and walls of the guard ring is from 600 to 1000 $\mu$m thick. Thus, for an implanted wafer approximately 5 cm. (2 inch) in diameter, the inside dimension of the guard ring is approximately 5.7 cm. (2.25 inches) in diameter and the outside dimension of the base, the guard ring and the lid is approximately 7.6 cm. (3 inches) in diameter. For an implanted wafer approximately 7.6 cm. (3 inches) in diameter, the inside dimension of the guard ring is approximately 8.3 cm. (3.25 inches) in diameter and the outside dimensions of the black-box components are approximately 10 cm. (4 inches) in diameter each. Different respective outside dimensions may be selected as well so as to fit a fastening arrangement of the tray being used.

Prior to annealing, base 10, is placed on tray 8, guard ring 11 is placed on base 10, the implanted and encapsulated wafer 1 with the implanted side facing up is placed on base 10 within a cavity formed by guard ring 11, and then lid 12 is placed over guard ring 11 to enclose wafer 1 within the so-formed black-box. Alternatively, wafer 1 may be placed on base 10 prior to placing the guard ring on the base or the black box with wafer 1 may be assembled prior to placing the black box on the tray.

Figure 3:
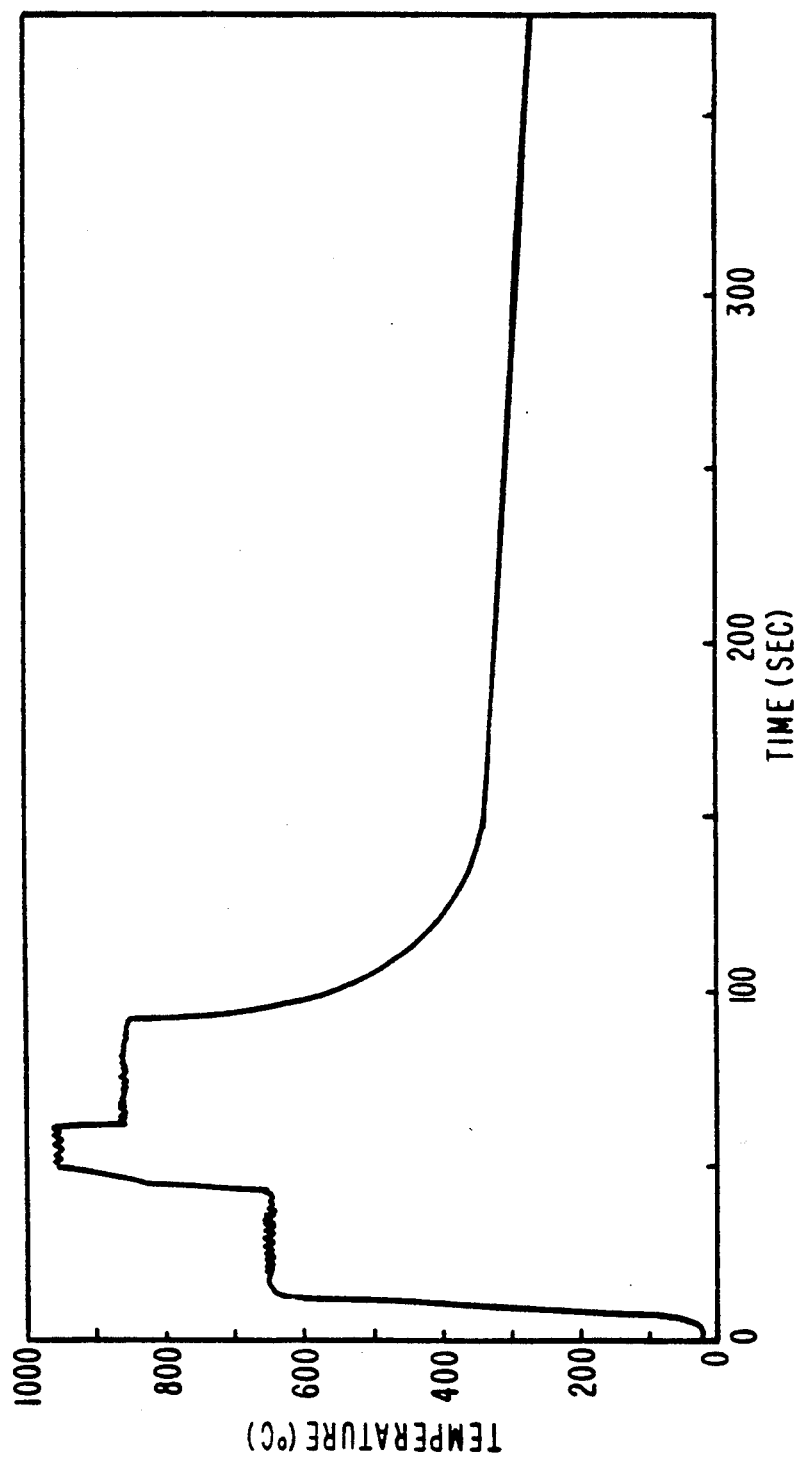
FIG. 3 is a graph of a three-step annealing cycle for annealing Si-implanted GaAs wafers.

After establishing a flow of dry inert gas, such as $N_2$, through isolation tube 4 and, thus, over the black box, wafer 1 was subjected to an RTA. In the particular example, the annealing cycle was a three-step anneal cycle consisting of a pre-anneal step, main annealing pulsed step and a post-anneal step, followed by a cool-down as is shown in FIG. 3.

The pre-anneal step is conducted by raising the temperature to within a range of from 625° to 675° C. and maintaining this temperature for a period sufficient to preheat not only the box, but also the wafer within the box. This reduces the effects of the thermal shock to which the wafer would be exposed upon being subjected directly to the higher annealing temperature. Preferably, the pre-anneal step is conducted at about 650° C. for a period of about 30 seconds. The main annealing pulsed step is conducted at temperatures ranging from 900° to 1000° C. for a period sufficient to anneal out the damage in the surface of wafer 1 caused by the ion implantation. A period of time of up to 50 seconds could be useful, with a period falling within a range of from 5 to 20 seconds being most suitable. Preferably, the main annealing pulse step is conducted at 950° C. peak temperatures for about 10 seconds. The post-anneal step is conducted at a temperature within a range of from 825° to 875° C., for a period of time sufficient to relieve stresses which may be caused by the high temperature anneal. Preferably, the post-anneal is conducted by maintaining the pulse-annealed wafer at about 850° C. for a period of about 30 seconds. After the post-anneal step, the wafer is permitted to cool down to at least 550° C. at a rate of from 5° to 50° C./second. Typically the cool-down proceeds at a cooling rate of approximately about 30° C./second or less. Annealed wafers 1 are removed from heating chamber 3 when their temperature falls below 200° C. After annealing, encapsulant 2 on annealed wafer 1 may be retained or, if an unencapsulated surface is desired for subsequent device processing, the encapsulant may be removed using $HF:H_2O$ etching solution.

To determine the effectiveness of the main annealing temperature and time on slip lines, a number of wafers were annealed at peak temperatures ranging from 925° to 1000° C. for times varying between 5 and 20 seconds. All wafers annealed in this way, when examined with an optical microscope, were entirely free from thermal damage. In order to examine the wafers for slip lines, they were etched in molten (300° C.) KOH for 20 min.

The effectiveness of the use of the black box with a guard ring and lid of graphite or silicon in eliminating slip lines is shown in FIGS. 4, 5, 6 and 7. In this experiment, four implanted and encapsulated wafers (shown in FIGS. 4, 5, 6 and 7 respectively from the same GaAs boule were annealed using the three-step cycle including pre-anneal step at 650° C. for about 30 seconds, main annealing pulse step with peak temperature of 950° C. for about 10 seconds and post-anneal step at 850° C. for about 30 seconds. Wafers shown in FIGS. 4 6 and 7 respectively were permitted to cool from the post-anneal temperature of 850° C. at a natural cooling rate of about 30° C./second, while wafer shown in FIG. 5 was permitted to cool at a cooling rate of about 10° C./second.

Figure 4:
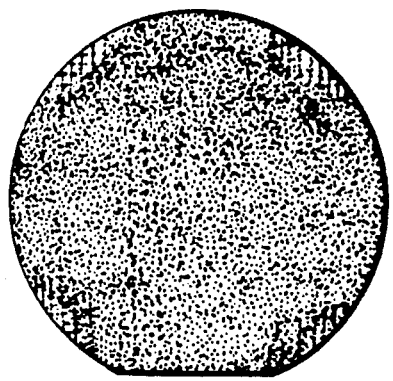
FIGS. 4, 5, 6 and 7 compare four different variants of effects of RTA on the morphological quality of RTA treated GaAs wafers.

Wafer shown in FIG. 4 was annealed inside a black box cavity formed by a base of silicon and a guard ring and a lid of graphite. The topographic distribution of the damage due to slip lines in this wafer was limited to only a small boundary region comprising of less than 10% of the surface. Wafer shown in FIG. 5 was annealed using the same type of the black box, but was permitted to cool down from 850° C. to about 600° C. at a slower rate of cooling ($\simeq$10° C./sec) than the first wafer. The results indicate that under these conditions, the wafer was totally free of slip lines. The reproducibility of this process was established with more than 20 wafers which were annealed at peak temperatures ranging between 925° and 1000° C. The mere use of slow cooling rate without the graphite guard ring and lid was unsuccessful in eliminating slip lines. Results obtained with a guard ring and lid of silicon were also highly satisfactory, comparable to those obtained with the guard ring and lid of graphite.

Figure 6:
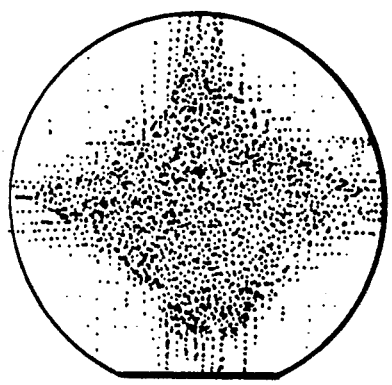
Figure 7:
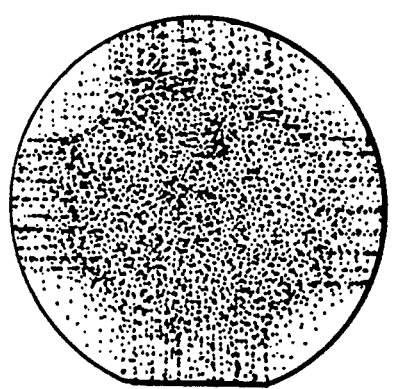
Figure 8:
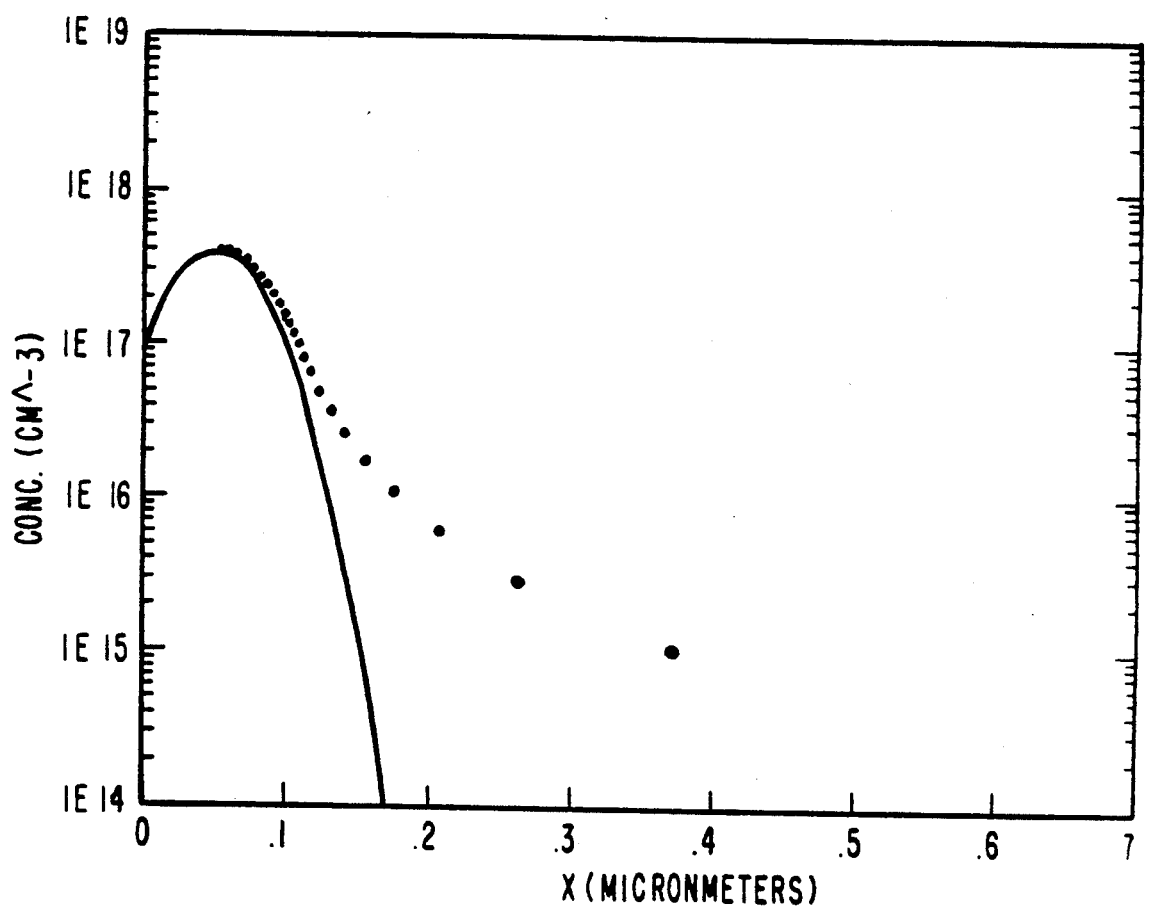
FIG. 8 discloses a carrier concentration profile vs depth profile for exemplary GaAs implanted with a dose of $3 \times 10^{12}$ cm$^{-2}$ of $^{29}$Si at 60 KeV and annealed using a three-step cycle of 650° C. for 30s—950° C. for 10s—850° C. for 30s.

For comparison purposes wafer shown in FIGS. 6 and 7 was annealed upon a silicon base, but without any guard ring or lid. The slip line density in this wafer was so high as to essentially render it useless for device fabrication. Wafer shown in FIG. 7 was annealed inside a cavity of a box formed by a fused $SiO_2$ guard ring and a silicon lid. In this case, although there was a slight reduction in the density of slip lines (relative to the density without the guard ring and lid), more than 75% of the wafer was not fit for device use. Results obtained with a guard ring of alumina and a silicon or graphite lid were also unsatisfactory, comparable to those obtained with the guard ring of fused silica.

These examples show that the use of a black-box implement including a guard ring and a lid of a black body material, such as either graphite or silicon, effectively eliminates the slip damage. A guard ring made of fused silica or alumina were found to be ineffective in preventing the slip lines. Similarly, unfavorable results were obtained when using guard ring and lid made of fused silica or alumina.

The advantage of the three step anneal over a two step anneal including a pre-anneal and a main annealing step was explored in the following way. A number of 5 cm. (2 inch) diameter wafers were split into two halves. One piece from each wafer was activated using a two step anneal of pre-anneal at 650° C. for about 30s followed by the main annealing at 950° C. for about 10s. The other piece of the same wafer was annealed using the three step cycle depicted in FIG. 3. Both anneal sets were carried out with the black box with base of silicon and with guard ring and lid of graphite. When examined for slip lines, both pieces were found to be slip-free. This shows that the black box is effective in avoiding slip lines with either two-step or three-step RTA.

However, the mobility and activity characteristics, obtainable from the two-step anneal were not as effective as those obtainable from the three-step anneal. Activation resulting from either two-step or three-step anneal was comparable and nearly 100%. However, average mobilities obtainable with two-step anneal were much lower than with the three-step anneal.

Figure 5:
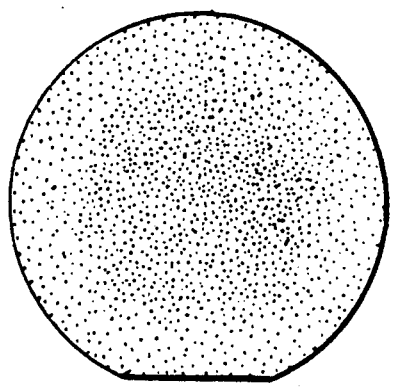

Carrier concentration versus depth profiles were obtained from C-V measurements on a mercury probe which was calibrated against a bulk n-GaAs standard using Ti-Au Schottky-barrier diodes. Results of C-V measurements yielded carrier concentration versus depth profiles which were in excellent agreement with theoretical LSS profile curves for both halves indicating nearly 100%-activation. A typical depth profile obtained from three-step annealing of 7.6 cm. (3 inch) diameter GaAs wafer is shown in FIG. 5 indicating the nearly 100%-activation. The LSS profile is given by the solid line. The solid curve represents the theoretical or LSS curve and is obtained by using the projected range and projected standard deviation derived from the Lindhard, Scharft and Schlott theory. *Projected Range Statistics, Semiconductors and Related Materials,* 2nd Edition, by James F. Gibbon, William S. Johnson and Steven W. Mylroie; Halstead Press, John Wiley and Sons, Inc., New York.

Hall effect and sheet resistivity measurements were performed using the Van der Pauw method to examine the sheet carrier concentration ($N_g$) and average sheet mobility ($\mu m$) of the implanted active layer. Hall measurements on the two-step annealed pieces gave average mobilities ranging from 1500–2000 $cm^2$/V.S., whereas the three-step annealed samples had mobilities between 2500–3000 $cm^2$/V.S. This difference may be explained as follows. Local variation of mobility on a given wafer of GaAs is commonly observed and related to the variation of dislocations across the sample. There is a possibility of formation of trapped lattice defects during the anneal in view of the fact that rapid heating and cooling steps are involved in the RTA process. The presence of such trapped defects would result in poor mobility of majority carriers in the implanted layer. Thus, low measured mobilities on nearly 100%-activated layers obtained with the two-step anneal cycle (pre-anneal step at 650° C. for about 30 seconds, followed by main annealing pulsed step at 950° C. for about 10 seconds) may be attributed to the presence of EN1 traps.

Activated layers with reproducibly high mobility were obtained by the use of a three step anneal cycle in which the final step consisted of 850° C. anneal for about 30 seconds. Since higher mobilities are observed in wafers activated using a three-step anneal cycle, it is not unreasonable to assume that the EN1 traps did not form in this process. Otherwise, the presence of EN1 traps would result in lower mobility due to scattering of carriers. Nevertheless, it could be also assumed that if any EN1 trapped defects did result from the main annealing pulsed step, they must have been removed by the post anneal step. Indeed, this is supported by the observation by M. Kuzuhara and T. Nozaki, mentioned before, that the EN1 trap was annihilated by long term (duration > 25s) annealing.

We claim:

1. A process for fabricating a semiconductor device, which comprises
   subjecting to a Rapid Thermal Anneal (RTA) a wafer of semiconductor material having dopant ions implanted into at least one selected area of at least one surface thereof and a layer of an encapsulating material over the said surface, the said RTA including in succession, a pre-anneal step, a main annealing step and a post-anneal step, the pre-anneal step being conducted at a temperature and for a period sufficient to reduce any thermal shock to the semiconductor material which may result from the main-annealing step, the said pre-anneal temperature being lower than a peak temperature of the main annealing step, the main annealing step being conducted at a temperature and for a period sufficient to remove damage caused to the said surface by the ion implantation and to activate dopant ions in said at least one selected area of the said surface of the wafer, and a post-anneal step being conducted at a temperature and for a period sufficient to relieve stresses which may result from the main-annealing step, wherein prior to said RTA, enclosing the wafer within a cavity of a container (hereinafter referred to as a "black-box") comprising a base, an annular guard ring and a lid, said base, guard ring and lid comprising black-body material stable under annealing conditions.

2. A process for fabricating a semiconductor device, which comprises enclosing a wafer of semiconductor material within a cavity of a container (hereinafter referred to as a black-box) comprising a base, an annular guard ring and a lid, said base, guard ring and lid comprising black-body material stable under annealing conditions, said wafer having dopant ions implanted into at least one selected area of at least one surface thereof and a layer of an encapsulating material over the said surface, and subjecting said wafer to a Rapid Thermal Anneal (RTA) including in succession a pre-anneal step, a main annealing step and a post-anneal step, and wherein said compound semiconductor material comprises GaAs, and said RTA includes exposure of the black-box with the wafer therein in succession to the pre-anneal step at temperatures ranging from 625° to 675° C. for a period of from 20 to 40 seconds, the main annealing step at a peak temperature within a range of from 900° to 1000° C. for a period of from 5 to 20 seconds, and the post-anneal step at temperatures ranging from 825° to 875° C. for a period of from 25 to 35 seconds, followed by cool down at a rate of from 5° to 50° C. per second.

3. The process of claim 2 in which said RTA includes exposure of the black-box with the wafer therein in succession to a pre-anneal at a temperature of about 650° C. for about 30 seconds, the main annealing at a peak temperature of about 950° C. for about 10 seconds, and a post-anneal at a temperature of about 850° C. for about 30 seconds, followed by cool-down at a rate of from 5° to 50° C. per second.

4. The process of claim 2 in which said cool-down is at a rate of up to 30° C. per second.

5. The process of claim 2 in which said cool-down is at a rate of about 10° C. per second.

6. The process of claim 1 in which said encapsulating material comprises a glass selected from the group consisting of phosphosilicate glass, borosilicate glass and Vycor ®.

7. The process of claim 1 in which said encapsulating material comprises phosphosilicate glass comprising 2-10 mole percent $P_2O_5$.

8. The process of claim 1, in which the black-box material of the base, the guard ring and the lid of the box comprises material selected from graphite and silicon.

9. The process of claim 8 in which the material of said guard ring comprises graphite.

10. The process of claim 8 in which the material of the guard ring and of the lid comprises graphite.

11. The process of claim 8 in which the material of said guard ring comprises silicon.

12. The process of claim 8 in which the material of the guard ring and of the lid comprises silicon.

13. The process of claim 8 in which the material of said base comprises silicon.

14. The process of claim 1 in which internal surfaces of said black box are encapsulated with a layer of encapsulating material which may or may not be similar to the encapsulating material on the said at least one surface of the wafer.

15. The process of claim 14 in which said encapsulating material is selected from the group consisting of phosphosilicate glass, borosilicate glass, Vycor ®, and $SiO_2$.

16. The process of claim 14 in which the encapsulating material comprises phosphosilicate glass comprising 2-10 mole percent $P_2O_5$.

17. The process of claim 1 in which said semiconductor material comprises compound semiconductor material selected from III-V and II-VI compound semiconductor materials.

18. The process of claim 1, in which said III-V semiconductor material is selected from the group of compound semiconductors consisting of GaAs, InP, InGaAs, InGaAsP, AlInAs, and AlInAsP.

19. The process of claim 1 in which said III-V semiconductor material comprises GaAs.

20. The process of claim 1 in which said semiconductor device is an avalanche photodiode.

21. A process for annealing semiconductor materials, which comprises enclosing a wafer of semiconductor material in a container (hereinafter referred to as a "black-box") having components comprising a base, a guard ring and a lid, said guard ring resting on the base and said lid resting on the guard ring, said black-box components comprising black-body material stable under annealing conditions said wafer having dopant ions implanted into at least one selected area of at least one surface thereof and a layer of an encapsulating material over the said surface, and subjecting the semiconductor material within the black-box to a Rapid Thermal Anneal (RTA) including in succession a pre-anneal step, a main-annealing step and a post-anneal step, conducting said pre-anneal step at a temperature and for a period sufficient to reduce thermal shock to the semiconductor material which may result from the main annealing step, the temperature of the pre-anneal step being lower than the temperature of the main-annealing step, conducting said main-annealing step by subjecting the wafer to a temperature and for a period sufficient to remove damage caused to the said surface by the ion implantation and to activate dopant ions in said at least one selected area of the surface of the wafer, and conducting said post-anneal step at a temperature and for a period sufficient to relieve stresses which may result from the main-annealing step.

22. The process of claim 21, in which the black-box material of the base, the guard ring and the lid of the box comprises material selected from the group consisting of graphite and silicon.

23. The process of claim 22 in which the material of said guard ring comprises graphite.

24. The process of claim 22 in which the material of the guard ring and of the lid comprises graphite.

25. The process of claim 22 in which the material of said guard ring comprises silicon.

26. The process of claim 22 in which the material of the guard ring and of the lid comprises silicon.

27. The process of claim 22 in which the material of said base comprises silicon.

28. The process of claim 22 in which internal surfaces of said box are encapsulated with a layer of encapsulating material.

29. The process of claim 28 in which said encapsulating material is selected from the group consisting of phosphosilicate glass, borosilicate glass, Vycor ® and SiO$_2$.

30. The process of claim 28 in which the encapsulating material comprises phosphosilicate glass comprising 2-10 mole percent P$_2$O$_5$.

31. The process of claim 21 in which said semiconductor material is a wafer of semiconductor material having ions implanted into at least one selected area of at least one surface thereof, said annealing being conducted at a temperature and for a period sufficient to remove damage caused to that surface by ion implantation and to activate dopant ions in said at least one selected area of said at least one surface of the semiconductor.

32. A process for annealing semiconductor materials, which comprises enclosing a wafer of semiconductor material in a container (hereinafter referred to as a black box) having components comprising a base, a guard ring and a lid, said guard ring resting on the base and said lid resting on the guard ring, said black-box components being of a black-body material stable under annealing conditions, said wafer having dopant ions implanted into at least one selected area of at least one surface thereof and a layer of an encapsulating material over the said surface, and subjecting the semiconductor material within the black-box to a Rapid Thermal Anneal (RTA), wherein said semiconductor material comprises GaAs, said RTA includes exposure of the black-box with the wafer therein in succession to a pre-anneal at temperatures ranging from 625° to 675° C. for a period of from 20 to 40 seconds, the main annealing step at a peak temperature within a range of from 900° to 1000° C. for a period of from 5 to 20 seconds, and a post-anneal at temperatures ranging from 825° to 875° C. for a period of from 25 to 35 seconds, followed by cool down at a rate of from 5° to 50° C. per second.

33. The process of claim 32 in which said RTA includes exposure of the black-box with the wafer therein in succession to a pre-anneal at a temperature of about 650° C. for about 30 seconds, the main annealing at a peak temperature of about 950° C. for about 10 seconds, and a post-anneal at a temperature of about 850° C. for about 30 seconds, followed by cool-down at a rate of from 5° to 50° C. per second.

34. The process of claim 33 in which said cool-down is at a rate of up to 30° C. per second.

35. The process of claim 33 in which said cool-down is at a rate of about 10° C. per second.

36. The process of claim 21 in which said encapsulating material comprises a glass selected from the group consisting of phosphosilicate glass, borosilicate glass and Vycor ®.

37. The process of claim 21 in which said encapsulating material comprises phosphosilicate glass comprising 2-10 mole percent P$_2$O$_5$.

38. The process of claim 21 in which said semiconductor material comprises compound semiconductor material selected from III-V and II-VI compound semiconductor materials.

39. The process of claim 21 in which said III-V semiconductor material is selected from the group of compound semiconductors consisting of GaAs, InP, InGaAs, InGaAsP, AlInAs, and AlInAsP.

40. The process of claim 21 in which said III-V semiconductor comprises GaAs.

41. The process of claim 2 in which said encapsulating material comprises a glass selected from the group consisting of phosphosilicate glass, borosilicate glass and Vycor ®.

42. The process of claim 2 in which said encapsulating material comprises phosphosilicate glass comprising 2-10 mole percent P$_2$O$_5$.

43. The process of claim 2 in which the black-box material of the base, the guard ring and the lid of the box comprises material selected from graphite and silicon.

44. The process of claim 43 in which the material of at least one of the base, the guard ring and the lid of the box comprises graphite.

45. The process of claim 43 in which the material of at least one of the base, the guard ring and of the lid comprises silicon.

46. The process of claim 2 in which internal surfaces of said black box are encapsulated with a layer of an encapsulating material which may or may not be similar to the encapsulating material on the said at least one surface of the wafer.

47. The process of claim 46 in which said encapsulating material is selected from the group consisting of phosphosilicate glass, borosilicate glass, Vycor ®, and SiO$_2$.

48. The process of claim 46 in which the encapsulating material comprises phosphosilicate glass comprising 2-10 mole percent P$_2$O$_5$.

49. The process of claim 32, in which the black-box material of the base, the guard ring and the lid of the box comprises material selected from the group consisting of graphite and silicon.

50. The process of claim 49 in which the material of at least one of the base, the guard ring and the lid comprises graphite.

51. The process of claim 49 in which the material of at least one of the base, the guard ring and the lid comprises silicon.

52. The process of claim 32 in which internal surfaces of said black box are encapsulated with a layer of an encapsulating material.

53. The process of claim 52 in which said encapsulating material is selected from the group consisting of phosphosilicate glass, borosilicate glass, Vycor ® and SiO$_2$.

54. The process of claim 52 in which the encapsulating material on said semiconductor surface comprises phosphosilicate glass comprising 2-10 mole percent P$_2$O$_5$.

55. The process of claim 32 in which said encapsulating material comprises a glass selected from the group consisting of phosphosilicate glass, borosilicate glass and Vycor ®.

56. The process of claim 55 in which said encapsulating material comprises phosphosilicate glass comprising 2-10 mole percent P$_2$O$_5$.

* * * * *

UNITED STATES PATENT AND TRADEMARK OFFICE
CERTIFICATE OF CORRECTION

PATENT NO. : 5,011,794

DATED : April 30, 1991

INVENTOR(S) : Karen A. Grim, Bertram Schwartz, Shobha Singh, LeGrand G. VanUitert, George J. Zydzik It is certified that error appears in the above-identified patent and that said Letters Patent is hereby corrected as shown below:

Cover page, Inventors, after "Karen A. Grim, Reading, Pa.;" please add --Bertram Schwartz, Westfield, N.J.--

Signed and Sealed this

Twentieth Day of October, 1992

Attest:

DOUGLAS B. COMER

Attesting Officer          Acting Commissioner of Patents and Trademarks